US011165396B2

(12) United States Patent
Kanagal Ramesh et al.

(10) Patent No.: US 11,165,396 B2
(45) Date of Patent: Nov. 2, 2021

(54) AMPLIFIER ARRANGEMENT AND SENSOR ARRANGEMENT WITH SUCH AMPLIFIER ARRANGEMENT

(71) Applicant: ams International AG, Rapperswil (CH)

(72) Inventors: Srinidhi Koushik Kanagal Ramesh, Rapperswil (CH); Vincenzo Leonardo, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 141 days.

(21) Appl. No.: 16/617,107

(22) PCT Filed: May 25, 2018

(86) PCT No.: PCT/EP2018/063813
§ 371 (c)(1),
(2) Date: Nov. 26, 2019

(87) PCT Pub. No.: WO2018/219820
PCT Pub. Date: Dec. 6, 2018

(65) Prior Publication Data
US 2020/0186105 A1 Jun. 11, 2020

(30) Foreign Application Priority Data

May 30, 2017 (EP) ..................... 17173518

(51) Int. Cl.
*H03F 3/08* (2006.01)
*H03F 3/00* (2006.01)
(52) U.S. Cl.
CPC ............. *H03F 3/087* (2013.01); *H03F 3/005* (2013.01); *H03F 3/082* (2013.01)

(58) Field of Classification Search
CPC ........... H03F 3/087; H03F 3/005; H03F 3/082
(Continued)

(56) References Cited

U.S. PATENT DOCUMENTS 5,793,230 A 8/1998 Chu et al.

OTHER PUBLICATIONS

Ballini, M. et al.: " A 1024-Channel CMOS Microelectrode Array with 26,400 Electrodes for recording and stimulation of electrogenic cells in vitro" IEEE Journal of solid-state circuits, vol. 49, No. 11, pp. 2705-2719 (Nov. 1, 2014).

(Continued)

*Primary Examiner* — Khanh V Nguyen
*Assistant Examiner* — Khiem D Nguyen
(74) *Attorney, Agent, or Firm* — MH2 Technology Law Group LLP

(57) ABSTRACT

An amplifier arrangement comprises a sensor input and a first and a second amplifier. The first amplifier has a first amplifier output and a first input connected to a first reference potential terminal and a second input connected to the sensor input in a direct fashion and to the first amplifier output via a feedback path having a switched integration capacitor that is charged by the feedback path during a first switching phase and discharged during a second switching phase. The second amplifier has a second amplifier output, a first input connected to a second reference potential terminal and a second input. A first feedback capacitor is connected in-between two pairs of feedback switches. A second feedback capacitor is connected between the second amplifier output and the second input of the second amplifier. An impedance element is coupled between the second amplifier output and the sensor input.

15 Claims, 5 Drawing Sheets

(58) Field of Classification Search
USPC .............................................. 330/9, 308, 51
See application file for complete search history.

(56) References Cited

OTHER PUBLICATIONS

Chen, J. et al.: "A low-noise CMOS readout circuit at low frequency for MEMS capacitive Accelerometers," Asic, Asicon 09, IEEE 8th international conference on, IEEE Piscataway, NJ, USA, Oct. 20, 2009, pp. 313-316 (2009).
European Search Report for International Search Report for PCT/EP2018/219820, dated Aug. 17, 2018.

AMPLIFIER ARRANGEMENT AND SENSOR ARRANGEMENT WITH SUCH AMPLIFIER ARRANGEMENT

BACKGROUND OF THE INVENTION

The present disclosure relates to a sensor arrangement, in particular for providing a sensor frontend in optoelectronic applications, and further to a sensor arrangement with such an amplifier arrangement and an optical sensor.

Amplifier arrangements are widely used as sensor frontends. For example, in optoelectronics applications with photodiodes as receiver elements, the input signal is processed in order to eliminate unwanted, superimposed signal components arising from daylight or other light sources like lightbulbs, energy-saving lamps etc. This allows the target signal to be detected. Typical applications of such kind are photoelectric proximity switches, IR remote controls or the like.

For example, a conventional sensor frontend is split into two amplifier stages. The first stage may be implemented as a classical transimpedance amplifier, TIA, combined with an active, continuous time DC feedback loop. The second stage may be implemented as an integrator.

SUMMARY OF THE INVENTION

The present disclosure provides an improved amplifier concept for processing sensor signals.

The improved amplifier concept is based on the idea that in a forward path of the amplifier arrangement an integrating amplifier is used for processing a sensor signal at a sensor input, and in a feedback path a switched capacitor feedback is implemented. To this end an amplifier in the feedback path is not connected directly to an output of the amplifier in the forward path but via a feedback capacitor in a switchable fashion. An output current of the amplifier in the feedback path is provided to the sensor input via an impedance element. In this way an active, switched capacitor DC feedback for a regulation of a DC current at the sensor input is achieved.

The regulation of the DC current by means of an impedance element allows to compensate DC currents in both directions, i.e. positive and negative currents. This makes the amplifier arrangement suitable for either configuration with a connected sensor providing either positive or negative currents. For example, if a photodiode is used as a sensor, either the cathode or the anode of the photodiode can be connected to the input of the amplifier arrangement. In addition, using the impedance element in the DC current regulation does not require any translation of the signal reference due to the references used in the feedback amplifier. This saves chip area as well as power consumption. Moreover, less components are contributing to the overall noise.

The impedance element may e.g. be implemented as a resistive element, e.g. a resistor, or as a field effect transistor operated in its Triode region.

An amplifier arrangement according to the improved amplifier concept comprises a sensor input for connecting a sensor, a first amplifier and a second amplifier. The first amplifier comprises a first and a second input and a first amplifier output. The first input of the first amplifier is connected to a first reference potential terminal, and the second input of the first amplifier is connected to the sensor input in a direct fashion and to the first amplifier output via a first feedback path having a switched integration capacitor that is charged by the feedback path during a first switching phase and discharged during a second switching phase.

The second amplifier comprises a second amplifier output and a first and a second input, of which the first input is connected to a second reference potential terminal. The amplifier arrangement further comprises a switched capacitor feedback having a first and a second feedback capacitor. The first feedback capacitor is connected in between a first pair of feedback switches between the first amplifier output and the second reference potential terminal and in between a second pair of feedback switches between the second reference potential terminal and the second input of the second amplifier. The second feedback capacitor is connected between the second amplifier output and the second input of the second amplifier. An impedance element is coupled between the second amplifier output and the sensor input.

The improved amplifier concept hence provides a solution for a switched capacitor single stage amplifier frontend, e.g. for photodiodes, with an integrating characteristic and an active DC feedback loop. The single stage approach allows the saving of area and also results in a better noise and linearity performance. The switched capacitor approach of the DC feedback loop allows combining it with an integrating characteristic without facing any stability issues in the overall loop.

Such an amplifier frontend according to the improved amplifier concept can also act as a buffer for an analog-to-digital converter, ADC, for example a successive approximation ADC, SAR-ADC.

For example, the switched capacitor DC feedback provides an isolation of the loop decreasing the stability requirements of the arrangement. In particular, due to the switching of the first feedback capacitor, the second input of the second amplifier is at no time directly connected to the first amplifier output.

The first and the second reference potential terminal may be provided with a common mode voltage. Such common mode voltage may be different for the first and the second reference potential terminal. However, the same common mode voltage may be provided to both the first and the second reference potential terminal in various implementations.

The common mode voltages may be provided symmetrically with respect to positive and negative supply terminals, or may be provided in an asymmetric fashion which can allow more headroom for the DC current feedback and/or a signal to be sensed from a sensor at the sensor input.

The amplifier arrangement may include a control circuit for providing respective switching signals effecting the various switching phases.

In various implementations of the amplifier arrangement, the integration capacitor is charged by a current between the first amplifier output and the second input of the first amplifier during the first switching phase.

In some implementations the integration capacitor is discharged during the second switching phase by connecting terminals of the integration capacitor together or to a common potential terminal. For example, such a common potential terminal may be the first reference potential terminal.

In various implementations the first pair of feedback switches is closed during a third switching phase and open during at least a fourth switching phase. In such a configuration, the second pair of feedback switches is closed during the fourth switching phase and open during at least the third switching phase. The first, second, third and fourth switching phases are operated with a common clock period.

Particularly, the third and fourth switching phase are encompassed by the first switching phase, wherein the third switching phase follows after the fourth switching phase.

Accordingly, the feedback via the first feedback capacitor is only employed during the first switching phase which implements an integrating phase of the integration capacitor. For example, the first feedback capacitor is floating in a time period between the fourth switching phase and the third switching phase.

Preferably, the first and the second switching phase are non-overlapping. This ensures that at no time the second input of the first amplifier or the first amplifier output are connected to each other or to a common potential terminal.

In various embodiments a resistance value respectively impedance value of the impedance element and/or a capacitance value of the integration capacitor and/or the first and second feedback capacitor are adjustable, in particular during operation. In this way different gain settings or different DC current ranges can be provided. For a high noise performance it may be desirable to maximize a resistance value of the impedance element, as the impedance element may be a dominant noise contributor. Thus, a high resistance value respectively impedance value leads to a low noise contribution.

In various implementations of the amplifier arrangement, the first amplifier comprises at least one Miller capacitance as an internal feedback element. A charge stored on the at least one Miller capacitance is at least partially reset in a fifth switching phase that is non-overlapping with the first switching phase and encompasses or is identical to the second switching phase. Such an implementation can further reduce a swing at the sensor input at the end of an integration cycle.

For example, the first amplifier comprises a CMOS output state with a pair of a p-channel field-effect transistor and an n-channel field-effect transistor being serially connected. Each of the field-effect transistors has a Miller capacitance connected between a gate terminal and a drain terminal. A charge stored on the Miller capacitances is at least partially reset in a fifth switching phase that is non-overlapping with the first switching phase and encompasses the second switching phase.

For example, in one specific implementation, only during the fifth switching phase, the gate terminal of the p-channel field-effect transistor is connected to a positive supply terminal via a first diode element, the gate terminal of the n-channel field-effect transistor is connected to a negative supply terminal via a second diode element, and the drain terminals of the field-effect transistors are connected to the first reference potential terminal.

In an alternative implementation, only during the fifth switching phase, the gate terminal of the p-channel field-effect transistor is directly connected to a positive supply terminal, the gate terminal of the n-channel field-effect transistor is directly connected to a negative supply terminal, and the drain terminals are connected to the first reference potential terminal.

In a further alternative implementation, the first amplifier comprises an auxiliary amplifier having an inverting input coupled to the first reference potential terminal, a non-inverting coupled to the first amplifier output, and an output that is coupled to the gate terminals of the p-channel field-effect transistor and the n-channel field-effect transistor only during the fifth switching phase.

In the embodiments described above at a CMOS output stage, the first amplifier may comprise an input stage whose output is coupled to the gate terminals of the p-channel field-effect transistor and the n-channel field-effect transistor, e.g. via a translinear loop element.

A sensor arrangement according to the improved amplifier concept comprises an amplifier arrangement according to one of the embodiments described above and a photodiode coupled to the sensor input.

BRIEF DESCRIPTION OF THE DRAWINGS

In the following the improved amplifier concept is explained in detail using exemplary embodiments with reference to the drawings. Components that are functionally identical or have an identical effect bear identical reference signs. The description of components that correspond to one or another function will not be repeated in each of the following figures.

In the drawings.

DETAILED DESCRIPTION

Figure 1:
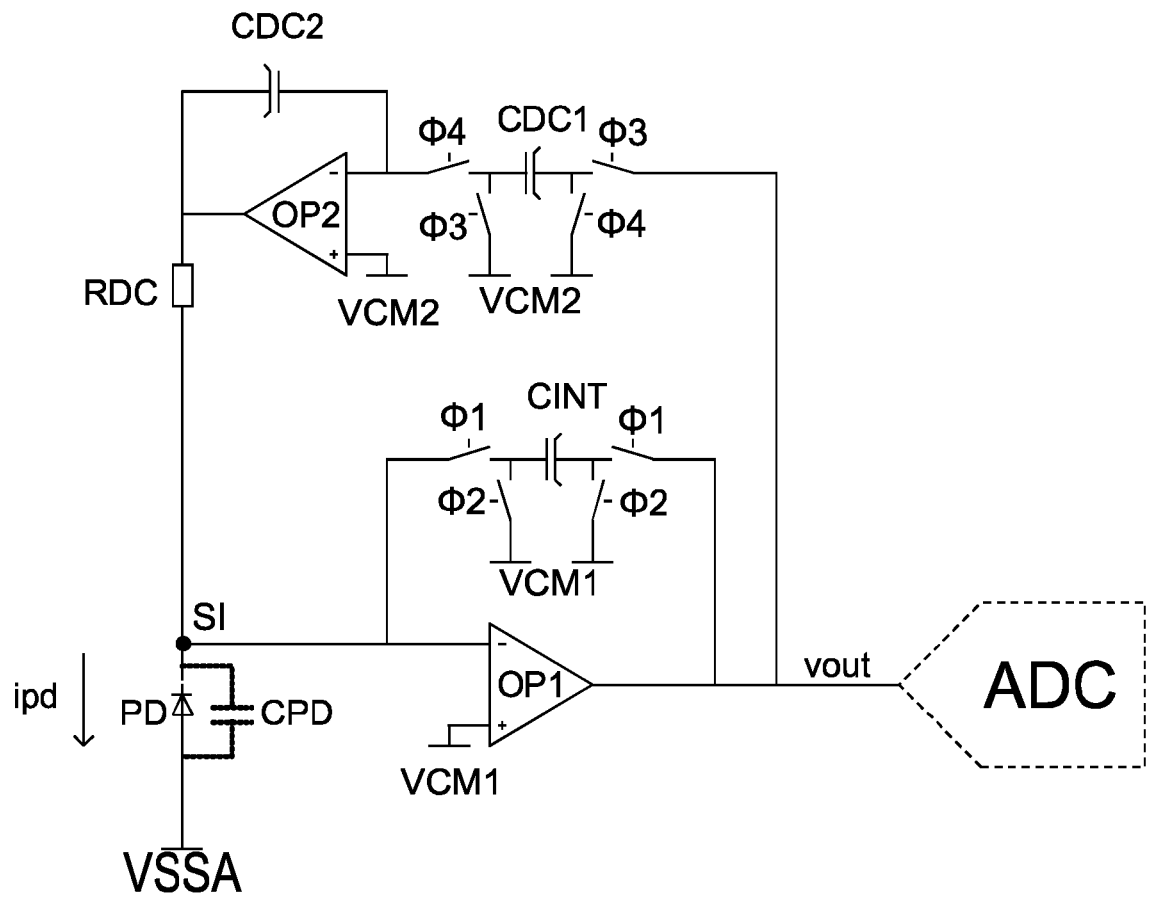
FIG. 1 shows an example implementation of an amplifier arrangement according to the improved amplifier concept.

FIG. 1 shows an example embodiment of an amplifier arrangement having a sensor input SI for connecting a sensor PD, and having an output for providing an output voltage vout, for example to an analog-to-digital converter ADC. The amplifier arrangement together with the sensor PD may form a sensor arrangement.

The amplifier arrangement comprises a first amplifier OP1 having a first, non-inverting input connected to a first reference potential terminal VCM1. A second, inverting input of the first amplifier OP1 is connected to the sensor input SI. An output of the first amplifier OP1 provides the output voltage vout. The first amplifier OP1 is operated in an integrator configuration. To this end, a first feedback path connects the second, inverting input of the first amplifier OP1 to the first amplifier output, including a switched integration capacitor CINT. A first pair of switches that are operated with a first switching signal Φ1 are configured to connect the integration capacitor CINT in the first feedback path, e.g. for charging the integration capacitor CINT during a first switching phase. A second pair of switches connects the terminals of the integration capacitor CINT to a common potential that is chosen to be the first reference potential terminal VCM1 in this example. However, as the second pair of switches controls discharging of the integration capacitor CINT, any other common potential could be chosen as well. The second pair of switches is operated by a second switching signal Φ2.

Hence, the first amplifier OP1 together with the integration capacitor CINT form a forward path of the amplifier arrangement that converts the input current ipd into an output voltage vout while it integrates the input current over the integration time Tint. After every integration time Tint the integration capacitance CINT is disconnected from the feedback, discharged and put back into the feedback of OP1 in a very short time Tres.

The amplifier arrangement further comprises an active, switched capacitor DC feedback that is implemented with a second amplifier OP2, a switched capacitor feedback having a first and a second feedback capacitor CDC1, CDC2, and an impedance element RDC connected to the sensor input SI. The impedance element RDC may e.g. be implemented as a resistive element, e.g. a resistor, or as a field effect transistor operated in its Triode region.

A first, non-inverting input of the second amplifier OP2 is connected to a second reference potential terminal VCM2. An output of the second amplifier OP2, referenced as a second amplifier output, is connected to a second, inverting input of the second amplifier OP2 by the second feedback capacitor CDC2. The impedance element RDC is connected between the second amplifier output and the sensor input SI. The switched capacitor feedback is implemented with a first pair of switches that are operated with a third switching signal Φ3 and that connect the first feedback capacitor CDC1 between the first amplifier output and the second reference potential terminal VCM2. A second pair of feedback switches that are operated with a fourth switching signal Φ4 surround the first feedback capacitor CDC1 between the second reference potential terminal VCM2 and the second input of the second amplifier OP2.

The sensor PD is implemented as a photodiode, in this example providing a current, in particular a photocurrent ipd, as a sensor signal. A parasitic capacitance CPD is shown for ease of illustration in parallel to the photodiode PD. In this example the cathode of the photodiode PD is connected to the sensor input SI, while the anode of the photodiode PD is connected to a common ground potential VSSA. In other example implementations anode and cathode of the photodiode PD can also be exchanged, thereby providing a sensor current with opposite sign compared to the depicted implementation. For example, the cathode is connected to a terminal or node having a potential greater than the voltage at terminal VCM1 in such alternative implementation.

In one application example, the amplifier arrangement is used for applications which use a controlled light source and detect the response via a sensor, e.g. a photodiode. Since a DC current, e.g. provided by the unwanted light source like sunlight etc., could be very high with respect to the target signal, it is desirable to remove it by the amplifier arrangement. This decreases the required dynamic range, respectively a resolution of the ADC that would be necessary without removing the unwanted signal portions.

Figure 2:
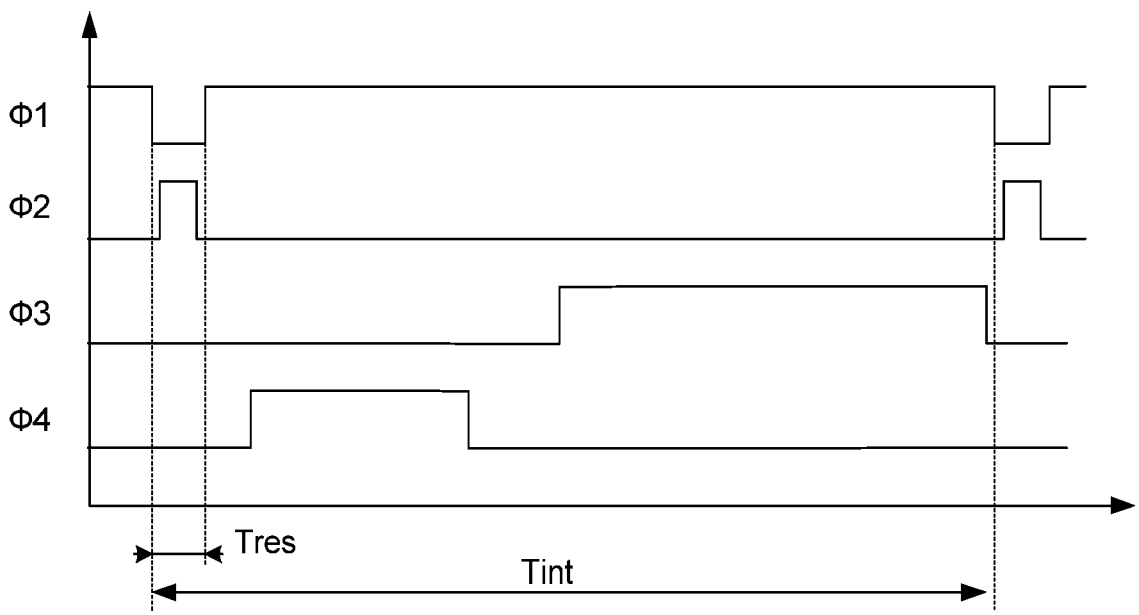
FIG. 2 shows an example signal diagram with switching signals to be employed in an amplifier arrangement according to the improved amplifier concept.

Referring now to FIG. 2, a signal diagram shows the various switching signals Φ1, Φ2, Φ3, Φ4 used in the amplifier arrangement. A first switching phase, denoted by the high signal level of the switching signal Φ1, represents the actual charging phase of the integration capacitor CINT. During the low level of the first switching signal Φ1, a second switching phase is set up by the high signal level of the second switching signal Φ2. During said second switching phase, the integration capacitor CINT is discharged or reset. The second switching phase is preferably non-overlapping with the first switching phase.

Accordingly, the integration capacitor CINT is charged by a current between the first amplifier output and the second input of the first amplifier OP1 during the first switching phase. Furthermore, the integration capacitor CINT is discharged during the second switching phase by connecting terminals of the integration capacitor CINT together or to a common potential terminal. Since the integration capacitor CINT is not connected in the feedback of the first amplifier OP1 during the discharging, it does not imply any requirements on the first amplifier OP1 in terms of speed.

The feedback path of the amplifier arrangement around the second amplifier OP2 samples the voltage vout at the integrator output, for example the peak voltage at the end of each integration time Tint, by means of the first feedback capacitor CDC1 and feeds it into the second feedback capacitor CDC2. In particular, this is done during the third switching phase indicated by a high signal level of a third switching signal Φ3. At the beginning of the next integration time Tint, the sampled voltage on first feedback capacitor CDC1 is fed to the second feedback capacitor CDC2 via the second pair of switches controlled by the fourth switching signal Φ4. In particular, the switches are closed in the high level times of the fourth switching signal Φ4 denoting a fourth switching phase. Accordingly, the switching phases are chosen to invert the sign and provide a voltage at the output of the second amplifier OP2 that generates a current of opposite sign across the impedance element RDC with respect to a DC input current.

Generally speaking, for example the switching phases can be chosen as follows:

The first pair of feedback switches is closed during the third switching phase and opened during at least the fourth switching phase. The second pair of feedback switches is closed during the fourth switching phase and opened at least during the third switching phase. The first, second, third and fourth switching phases are operated with a common clock period Tint. The third and fourth switching phases are encompassed by the first switching phase, wherein the third switching phase follows after the fourth switching phase. For example, the first feedback capacitor CDC1 is floating in a time period between the fourth switching phase and the third switching phase.

Figure 3:
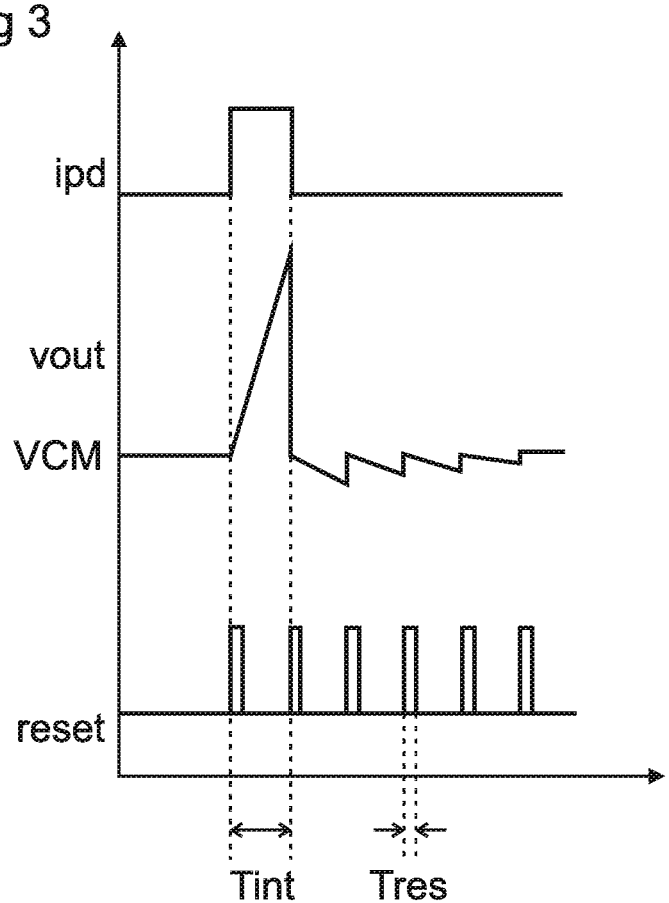
FIG. 3 shows an example signal diagram of signals in an embodiment of an amplifier arrangement according to the improved amplifier concept.
Figure 4:
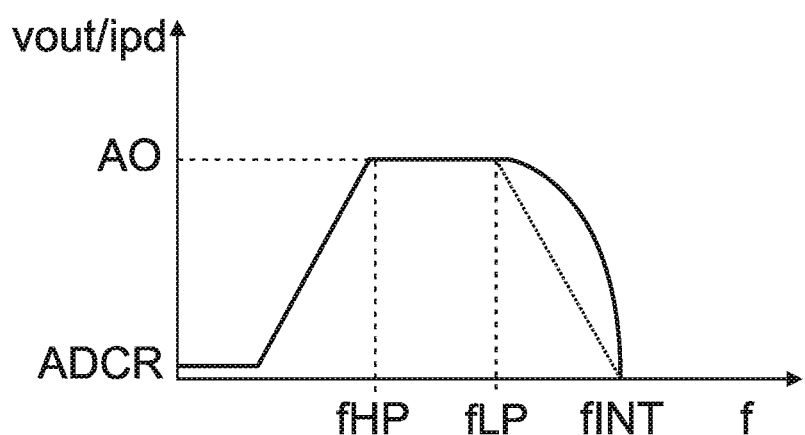
FIG. 4 shows a signal diagram representing an example transfer function of an amplifier arrangement according to the improved amplifier concept.

The properties explained above result in a transient response as depicted in FIG. 3 respectively in a corresponding transfer function depicted in FIG. 4. Referring to FIG. 3, it shows an input current ipd as a pulsed signal, and the resulting output voltage vout related to a common mode potential VCM that is provided to the first reference potential terminal VCM1. Preferably, the same common mode voltage VCM is also provided to the second reference potential terminal VCM2, which further increases performance. The reset signal shown in FIG. 3 corresponds to the second switching signal Φ2.

Referring now to FIG. 4, the feedback path around the second amplifier OP2 removes the low frequency components from the input signal IPD, resulting in a high pass corner frequency fHP. In this respect, the frequency fHP may be determined as:

$$fHP = \frac{Cdc1}{Cdc2} \cdot \frac{1}{2\pi \cdot Cint \cdot Rdc}$$

wherein Cdc1, Cdc2, Cint and Rdc represent the capacitance values, respectively resistance/impedance values of the elements in capital letters. A low pass corner frequency fLP denotes a frequency at which the integrating behavior of the arrangement starts. The low pass corner frequency fLP is determined as:

$$fLP = \frac{1}{2\pi \cdot Tint} = \frac{fINT}{2\pi}.$$

with fINT being the integration frequency. At frequencies between fHP and fLP the switched capacitor integrator acts as a standard transimpedance amplifier, TIA, providing a voltage vout which is proportional to the input current, having the transimpedance AO calculated as follows:

$$A0 = 20 \cdot \log\left(\frac{1}{fINT \cdot Cint}\right).$$

This is due to the fact that the integration capacitor CINT acts like a "resistance" at frequencies f<<fINT. One positive aspect of this property is that low frequency signal components do not eat up the dynamic range of the arrangement as it would be with a continuous integrator without resetting the integration capacitor CINT.

At frequencies between fLP and fINT the switched integrator provides an integrating behavior. This ensures that the target signal pulses with a pulse width of the integration time Tint are integrated completely within this time without losing any signal content. At frequencies below fHP, the DC suppression circuit removes the low frequency components of the input signal IPD as well as 1/f noise of the first amplifier OP1. Input signals above the high pass corner frequency fHP are not influenced by the DC suppression circuit around the second amplifier OP2.

For noise reasons, it is desirable to choose the resistance value respectively impedance value rdc of the impedance element RDC as high as possible. To this end, the values of the impedance and capacitive elements in this circuit preferably are made configurable to be able to adapt to a specific implementation or application around the amplifier arrangement.

The DC suppression described in conjunction with the arrangement of FIG. 1 is able to be used with positive and negative input currents. This leaves the flexibility to choose whether the photodiode PD or any other current-providing sensor is connected with the cathode or with the anode to the integrator input keeping the same frontend circuit.

During the reset time Tres, the feedback of the integrator via the integration capacitor CINT is not provided. While the amount of DC current is still provided by the impedance element RDC, the high frequency components are being integrated into the photodiode capacitance CPD. After reconnecting the integration capacitor CINT, the charge that was integrated on capacitance CPD is immediately fed into the integration capacitor CINT due to the resulting low impedance of the virtual ground at the sensor input SI. This prevents any signal content from being lost during the reset time. The affordable duration of the reset time Tres, i.e. the selection of an appropriate reset time Tres, is depending on the allowed voltage drop across the photodiode PD, its capacitance CPD and the expected signal strength ipd.

The amplifier arrangement according to the improved amplifier concept does not need any switches between the photodiode PD and the virtual ground, which results in less kTC noise contribution. Moreover, the kTC noise contributed by the switches on the left side of the integration capacitor CINT is rejected by the gain of the first amplifier OP1 and does not result as such. The resulting kTC noise contribution is equivalent to the noise of the first amplifier OP1 and not defined by the photodiode capacitance CPD itself.

The common mode voltage VCM provided at the first and/or the second reference potential terminal VCM1, VCM2 is not required to be provided at half supply voltage. Depending on the expected signals, it can be set such to optimize the available dynamic range. By making the common mode voltage VCM asymmetric, both signal and DC current range may be maximized.

If the second amplifier OP2 is referred to the same common mode potential VCM as the main amplifier OP1, it does not add any noise from VCM. Noise from VDD is rejected by the PSRR of both amplifiers OP1 and OP2.

In some configurations, the output voltage can be observed by means of a comparator such to detect a possible saturation of the output voltage. As soon as the output voltage vout becomes higher than a given threshold, the signal source of the target signal can be switched off immediately. Such a procedure can assure that a target signal is detected without saturating the output. It is apparent to the skilled person that such a configuration is only possible if a connection between the optional comparator and a light-emitting unit for providing a light source is present.

Figure 5:
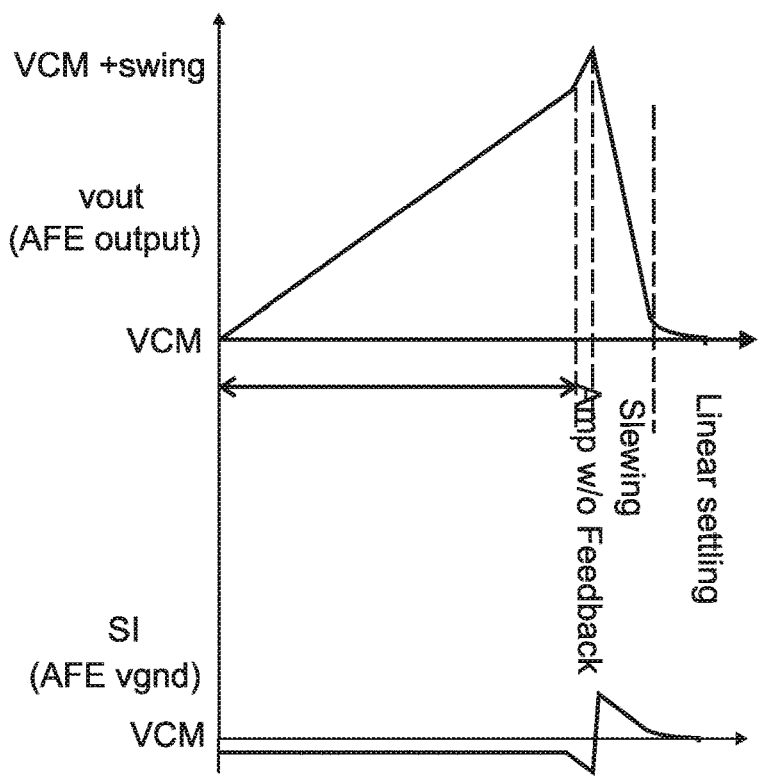
FIG. 5 shows an example signal diagram in conjunction with the improved amplifier concept.

In various implementations, the first amplifier OP1 may have included some kind of Miller compensation for improving signal performance. However, this may have the effect that signal-dependent charge is stored in the Miller capacitors at the end of a reintegration cycle. This may result in a swing in the amplifier's virtual ground, respectively the sensor input. An example of such behavior is shown in FIG. 5. As can be seen from the upper signal vout, the output voltage vout increases in the time period where the amplifier has no active feedback. Due to the absence of feedback, the virtual ground of the amplifier can drift lower. However, after the feedback capacitor is reconnected, the amplifier may slew to settle the charge on the feedback capacitor. This may result in a high non-linearity.

Hence, if it is desired to avoid such behavior it is proposed according to the improved amplifier concept to provide a resetting of the one or more Miller capacitances used in the first amplifier OP1 as internal feedback elements. For example, a charge stored on the at least one Miller capacitance can be at least partially reset in a fifth switching phase that is non-overlapping with the first switching phase and encompasses or is identical to the second switching phase. In other words, the Miller capacitances is/are reset during the time, when the integration capacitor CINT is not connected in the first feedback path, i.e. is not charged.

Figure 6:
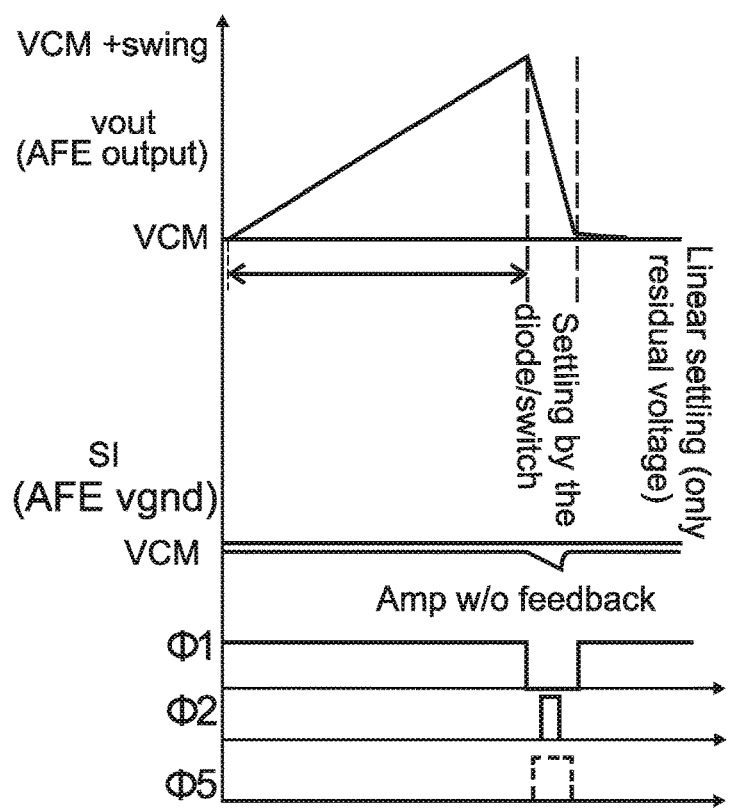
FIG. 6 shows a further signal time diagram of signals in conjunction with the improved amplifier concept.

An example of such a switching scheme is shown in conjunction with FIG. 6 with the fifth switching signal Φ5, resetting the at least one Miller capacitance during the high signal level. As shown in the figure, the amplifier does not have to slew/settle after the feedback is connected since charge stored on the Miller capacitor has already been reset. Consequently, the virtual ground at the amplifier frontend, respectively the sensor input SI, reduces its swing compared to the signal shown in FIG. 5.

Resetting of the Miller capacitance reduces non-linear effects, as a non-linear swing of the virtual ground during every reset is avoided. Furthermore, non-linear capacitances at the amplifier input, e.g. of the photodiode and any switches connected to it, have reduced effect. Moreover, the noise contribution of the first amplifier can be reduced due to avoiding of slewing and storing noise in the capacitor during integration. Furthermore, a temperature coefficient of the output of the amplifier arrangement can be improved.

Figure 7:
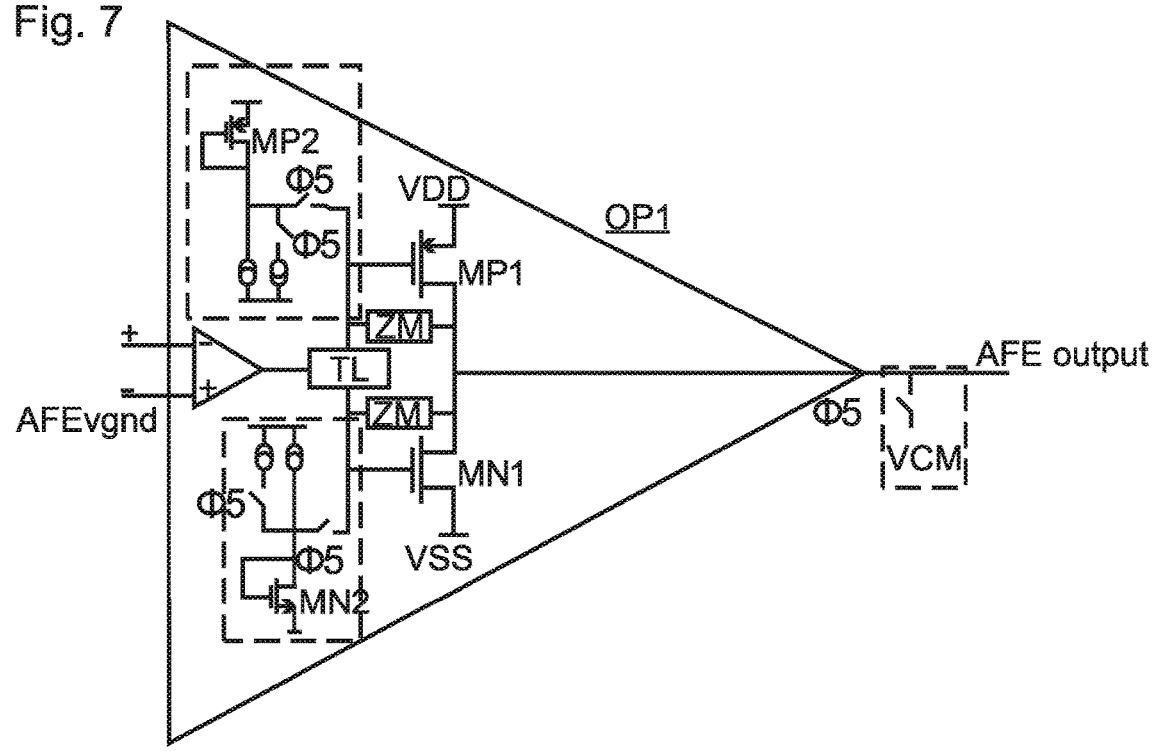
FIG. 7 shows an example implementation of an amplifier in conjunction with the improved amplifier concept.
Figure 8:
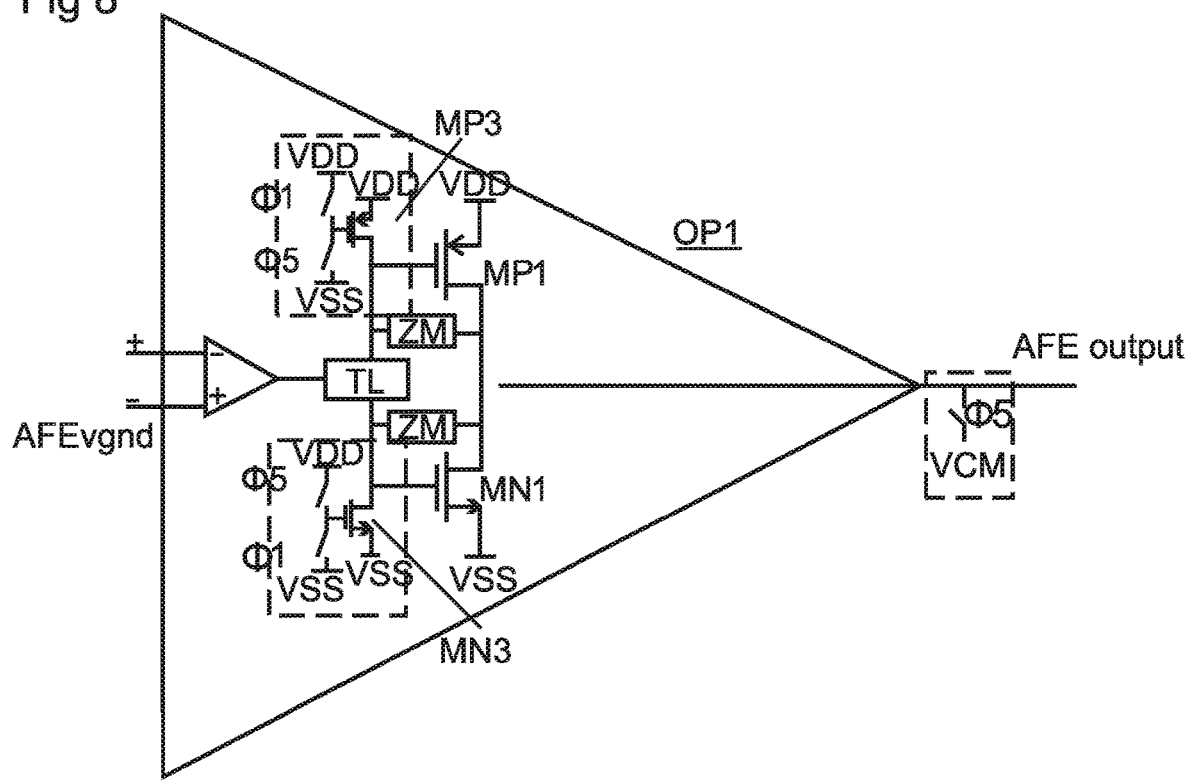
FIG. 8 shows a further example implementation of an amplifier in conjunction with the improved amplifier concept.
Figure 9:
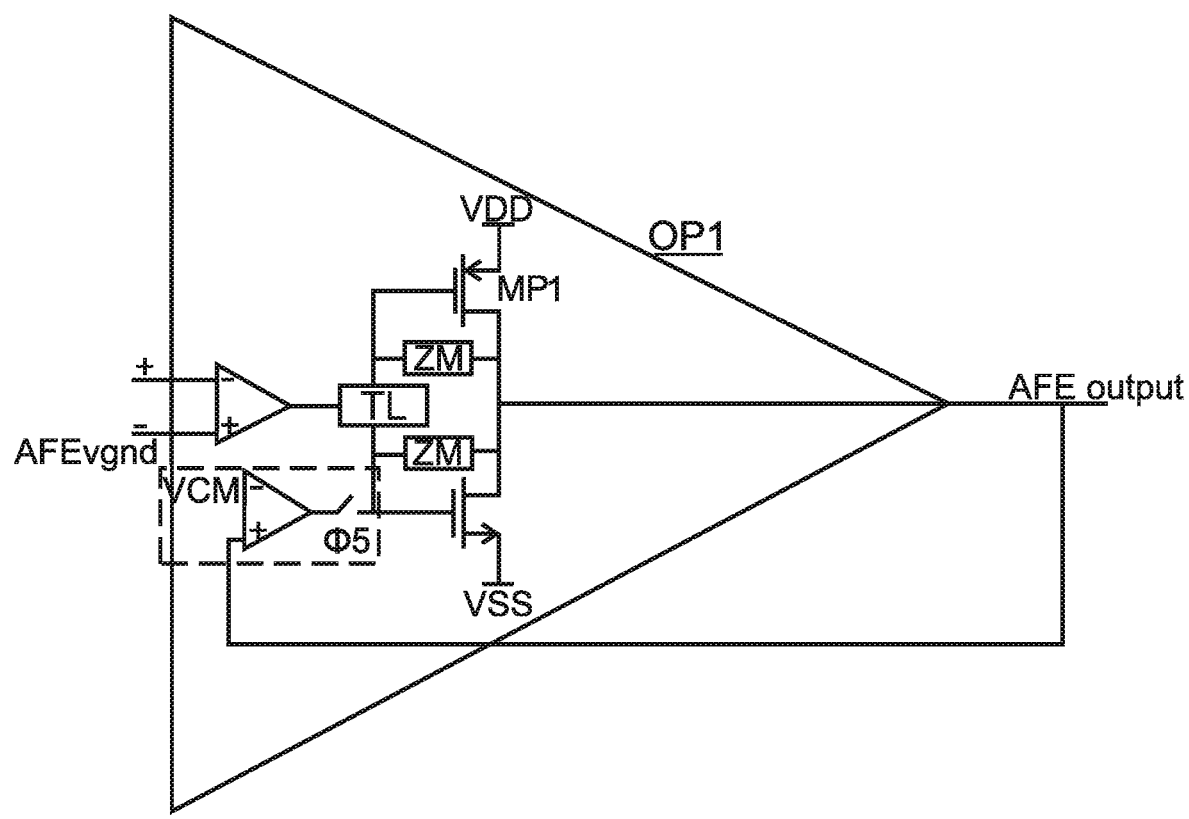
FIG. 9 shows a further example implementation of an amplifier in conjunction with the improved amplifier concept.

Several examples of amplifier stages used as the first amplifier OP1 are shown in FIG. 7, FIG. 8 and FIG. 9, each employing a reset of the at least one Miller capacitance used in the amplifier. However, these examples should be understood as non-limiting.

Each of the first amplifiers OP1 in FIG. 7, FIG. 8 and FIG. 9 includes a CMOS output stage with a transistor pair built from a p-channel field-effect transistor MP1 and an n-channel field-effect transistor MN1 being serially connected in between a positive supply terminal VDD and a negative supply terminal VSS. As is well-known in the art, a connection between the two transistors MP1, MN1 forms an output of the CMOS output stage. Each of the field-effect transistors MP1, MN1 has a Miller capacitance ZM connected between its gate terminal and its drain terminal. Each of the first amplifiers OP1 further includes an input stage denoted symbolically with an operational amplifier providing the first and the second amplifier input. An output of said input stage is connected to the gates of the transistor pair MP1, MN1 via a translinear loop element TL, for example.

Referring now to the specific implementation of FIG. 7, the implementation for resetting the Miller capacitances is shown in the dashed rectangles. For example, the gate terminal of the p-channel transistor MP1 is connected to a diode connected transistor MP2 via a switch controlled by the fifth switching signal Φ5. Furthermore, a current source is connected to the drain of the diode connected transistor MP2 fixedly, and a further current source is connected in parallel via a further switch controlled by the fifth switching signal Φ5. In a similar, symmetric fashion, the gate terminal of the n-channel transistor MN1 is connected to the diode connected transistor MN2 in a symmetric configuration with switches that are controlled by the fifth switching signal Φ5. Moreover, the drain terminals of the CMOS output pair MP1, MN1 that forms the output of the amplifier OP1 is connected to the first reference potential terminal for providing the common mode voltage VCM. Hence, when the switches are closed by the fifth switching signal Φ5, the first amplifier output is driven to the common mode voltage VCM.

Preferably, the respective diode connected transistors MP2, MN2 are lower in their threshold voltage when compared to the respective transistor of the CMOS output pair MP1, MN1, for example by a couple of tens of millivolt. This may be accomplished by a process option or by making the W/L ratio of the diode transistor MP2, MN2 three to five times greater than that of the output transistors MP1, MN1. By doing so, the voltage across the Miller capacitor ZM is driven to the gate source voltage and VCM for the NMOS and PMOS transistors MP1, MN1, respectively. As a result, almost no additional settling needs to be done by the amplifier in the next integration phase.

Referring now to FIG. 8, the implementation for resetting the Miller capacitances ZM is shown in the dashed rectangles again. Like in the example of FIG. 7, the first amplifier output is connected to the first reference potential terminal for providing the common mode voltage VCM depending on the fifth switching signal Φ5. The gate terminal of the p-channel transistor MP1 is connected to the positive supply terminal VDD by means of a transistor switch MP3. Similarly, the gate of the n-channel transistor MN1 is connected to the negative supply terminal VSS via a transistor switch MN3. The gate terminals of the transistor switches MP3, MN3 are connected either to the positive supply terminal VDD or the negative supply terminal VSS by respective switches being operated with the first switching signal Φ1, respectively the fifth switching signal Φ5. Hence, during the fifth switching phase the transistors MP3, MN3 are brought to a closed state such that the Miller capacitances ZM are connected to the positive supply terminal VDD respectively the negative supply terminal VSS.

During the first switching phase, respectively the integration phase, the transistor switches MP3, MN3 are open, leaving the gate terminals of transistors MP1, MN1 without further influence from the supply terminals. Hence, at the beginning of the integration phase, respectively first switching phase, only a small amount of differential charge is drawn resulting in that the amplifier is not slewing. Only a common mode charge is drawn from the translinear loop to settle the gates back to a gate source voltage above VSS for transistor MN1 and below VDD for transistor MP1. Hence, no non-linearity or any of the above-mentioned effects results.

Referring now to FIG. 9, the gates of the PMOS and NMOS transistors MP1, MN1 are connected to an auxiliary amplifier that is turned on only during the short reset time given by the fifth switching signal Φ5 to save power. The auxiliary amplifier could be implemented as a high speed amplifier. Due to the feedback of the auxiliary amplifier to the first amplifier output, and the common mode voltage VCM provided at the other input of the auxiliary amplifier, the first amplifier output is driven to the common mode voltage VCM during the fifth switching phase, thereby resetting the Miller capacitances ZM.

There is no need for any additional capacitance for this feedback loop since the Miller capacitance ZM is also used as a compensation capacitor for this loop as well.

While the examples shown in FIG. 7, FIG. 8 and FIG. 9 are implemented with Class AB amplifiers, the resetting of the Miller capacitance is equally applicable to a Class A amplifier and/or a nested Miller compensation or any other form of Miller compensation.

The implementations according to the improved amplifier concept need only a little more area on a chip as only a few switches that can be sized to be very small and a few diodes/current mirrors are needed. Similarly, only a little more power is needed in addition, compared to an active current of a conventional frontend. A simple non-overlap generation circuit is sufficient to generate the fifth switching phase for resetting the Miller capacitances. Due to this simple switching scheme high reliability can be achieved. As mentioned above, the same signal as used for the second switching phase can be used for the fifth switching phase.

The invention claimed is:
1. An amplifier arrangement, comprising
a sensor input for connecting a sensor;
a first amplifier comprising a first amplifier output and a first and a second input, of which the first input is connected to a first reference potential terminal, and of which the second input is connected to the sensor input in a direct fashion and to the first amplifier output via a first feedback path having a switched integration capacitor that is charged by the feedback path during a first switching phase and discharged during a second switching phase;
a second amplifier comprising a second amplifier output and a first and a second input, of which the first input is connected to a second reference potential terminal;

a switched capacitor feedback having a first and a second feedback capacitor, wherein the first feedback capacitor is connected in-between a first pair of feedback switches between the first amplifier output and the second reference potential terminal and in-between a second pair of feedback switches between the second reference potential terminal and the second input of the second amplifier, and wherein the second feedback capacitor is connected between the second amplifier output and the second input of the second amplifier; and an impedance element coupled between the second amplifier output and the sensor input.

2. The amplifier arrangement according to claim 1, wherein the switched integration capacitor is charged by a current between the first amplifier output and the second input of the first amplifier during the first switching phase.

3. The amplifier arrangement according to claim 1, wherein the switched integration capacitor is discharged during the second switching phase by connecting terminals of the switched integration capacitor together or to a common potential terminal.

4. The amplifier arrangement according to claim 1, wherein
the first pair of feedback switches is closed during a third switching phase and open during at least a fourth switching phase;
the second pair of feedback switches is closed during the fourth switching phase and open during at least the third switching phase;
the first, second, third and fourth switching phase are operated with a common clock period; and
the third and fourth switching phase are encompassed by the first switching phase, the third switching phase following after the fourth switching phase.

5. The amplifier arrangement according to claim 4, wherein the first feedback capacitor is floating in a time period between the fourth switching phase and the third switching phase.

6. The amplifier arrangement according to claim 4, wherein the first and the second switching phase are non-overlapping.

7. The amplifier arrangement according to claim 1, wherein the impedance element is implemented as a resistive element, in particular a resistor.

8. The amplifier arrangement according to claim 1, wherein an impedance value of the impedance element and/or a capacitance value of the switched integration capacitor and/or the first and second feedback capacitor are adjustable.

9. The amplifier arrangement according to claim 1, wherein the first amplifier comprises a CMOS output stage with a pair of a p-channel field effect transistor and an n-channel field effect transistor being serially connected, each of the field effect transistors having a Miller capacitance connected between a gate terminal and a drain terminal, and wherein a charge stored on the Miller capacitances is at least partially reset in a fifth switching phase that is non-overlapping with the first switching phase and encompasses the second switching phase.

10. The amplifier arrangement according to claim 9, wherein, only during the fifth switching phase, the gate terminal of the p-channel field effect transistor is connected to a positive supply terminal via a first diode element, the gate terminal of the n-channel field effect transistor is connected to a negative supply terminal via a second diode element, and the drain terminals are connected to the first reference potential terminal.

11. The amplifier arrangement according to claim 9, wherein, only during the fifth switching phase, the gate terminal of the p-channel field effect transistor is directly connected to a positive supply terminal, the gate terminal of the n-channel field effect transistor is directly connected to a negative supply terminal, and the drain terminals are connected to the first reference potential terminal.

12. The amplifier arrangement according to claim 9, wherein the first amplifier comprises an auxiliary amplifier having an inverting input coupled to the first reference potential terminal, a non-inverting input coupled to the first amplifier output, and an output that is coupled to the Gate terminals of the p-channel field effect transistor and the n-channel field effect transistor only during the fifth switching phase.

13. The amplifier arrangement according to claim 9, wherein the first amplifier comprises an input stage whose output is coupled to the Gate terminals of the p-channel field effect transistor and the n-channel field effect transistor via a translinear element.

14. The amplifier arrangement according to claim 1, wherein the first amplifier comprises at least one Miller capacitance as an internal feedback element, and wherein a charge stored on the at least one Miller capacitance is at least partially reset in a fifth switching phase that is non-overlapping with the first switching phase and encompasses the second switching phase.

15. A sensor arrangement comprising an amplifier arrangement according to claim 1 and a photodiode coupled to the sensor input.

* * * * *